US005144673A

United States Patent [19]

Matsumoto et al.

[11] Patent Number: 5,144,673

[45] Date of Patent: Sep. 1, 1992

[54] REFLECTION SOUND COMPRESSION APPARATUS

[75] Inventors: Masaharu Matsumoto, Katano; Mitsuhiko Serikawa, Hirakata; Akihisa Kawamura, Hirakata; Hiroko Yoshida, Hirakata; Katsuaki Sato, Osaka, all of Japan

[73] Assignee: Matsushita Electric Industrial Co., Ltd., Osaka, Japan

[21] Appl. No.: 623,619

[22] Filed: Dec. 7, 1990

[30] Foreign Application Priority Data

Dec. 12, 1989 [JP] Japan ................................ 1-322130

[51] Int. Cl.[5] ................................ H03G 3/00

[52] U.S. Cl. ................................ 381/61; 381/63; 84/630

[58] Field of Search ................................ 381/61, 63; 84/630, 84/603, 604

[56] References Cited

U.S. PATENT DOCUMENTS

| | | | |
|---|---|---|---|
| 4,005,268 | 1/1977 | Canell | 381/63 |
| 4,536,887 | 8/1985 | Kaneda | 381/92 |
| 4,706,291 | 11/1987 | Kakubo | 381/63 |
| 4,803,731 | 2/1989 | Niimi | 381/63 |
| 4,984,495 | 1/1991 | Fujimori | 84/630 |

FOREIGN PATENT DOCUMENTS

| | | |
|---|---|---|
| 58-3639 | 1/1983 | Japan . |
| 61-257099 | 11/1986 | Japan . |
| 61-261997 | 11/1986 | Japan . |
| 62-173900 | 7/1987 | Japan . |
| 63-87000 | 4/1988 | Japan . |

*Primary Examiner*—James L. Dwyer
*Assistant Examiner*—Jack Chiang
*Attorney, Agent, or Firm*—Wenderoth, Lind & Ponack

[57] ABSTRACT

A reflection sound compression apparatus extracts and compresses, most appropriately with a physical evaluation value, an impulse response of a hall, etc. which is obtained by calculation and actual experiments to reflection sounds in a number required by a sound field controller by using a learning identification method.

5 Claims, 4 Drawing Sheets

REFLECTION SOUND COMPRESSION APPARATUS

BACKGROUND OF THE INVENTION

1. Field of the Invention

The present invention relates to a reflection sound compression apparatus for installation in a sound field controller which allows an arbitrary sound field such as those in halls, etc. to be generated in a conventional room.

2. Prior Art

With the current development of hall simulation technology using the computer and the use of trend toward a digital technology for acoustic devices, the need for sound field control has been rapidly increasing. For this sound field control, a device for generating a sound field is used by performing convolution of a musical signal and an impulse response (reflection series) of a hall, etc., called a sound field controller. Although the convolution performed in this sound field controller can be realized by a DSP (digital signal processor) or a discrete IC, there is a limitation in the length of impulse response (the number of reflections) which is performed convolution from performance of the existing DSPs and ICs, and thus the convolution is normally being used by adjusting (compressing) the impulse responses measured in practice at the renown halls, etc. and also determined with simulation calculations, etc.

An explanation will follow of an example of the conventional reflection compression apparatus which compresses the above-mentioned impulse, response, with reference to drawings.

FIG. 3 shows a block diagram of a conventional reflection compression apparatus. In FIG. 3, numeral 10 represents a RAM memory circuit RAM (Random Access Memory) which stores an impulse response of hall, etc. determined by measurement or calculation; 11 represents a calculating circuit which calculates an average energy of the reflection sounds in the time interval from the impulse response stored in the memory circuit 10, and allocates the value at a position of the reflection sound at which the maximum value is obtainable within the time interval; 12 represents a setting circuit for setting the reflection sound determined by the circuit 11 on a sound field controller; 13 represents a sound field controller for producing a sound field by performing convolution of a musical signal and the reflection sound set by the setting circuit 12; 14 represents a group of speakers responsive to the output signal of the sound field controller 13; and $S_M$ represents musical signals reproduced by compact disks, etc.

FIGS. 4(A)–(C) are shows diagrams for exhibiting a method of calculation in the calculating circuit 11, in which FIG. 4(A) is a schematic diagram of impulse responses obtained by measurement or calculation followed by digital sampling, FIG. 4(B) illustrates a reflection sound determined by the calculation circuit 11 exhibiting the magnitude of reflection sound at Ei (i equals to 1–8), and FIG. 4(C) illustrates a reflection sound compressed into the practically processable number (in this case 6 pieces) at the sound field controller. Also, T as shown in FIG. 4 (B) represents a time interval in which the reflection sounds are extracted.

In the reflection sound compression apparatus as shown in FIG. 3, impulse responses as determined by the calculation for the simulation of impulse responses or sound ray method, etc. which were measured in real halls, etc. and are stored in the memory circuit. Then, the calculation circuit 11 calculates an average energy of reflection sound in a certain time interval as shown in FIG. 4, allocates the value at the position of the reflection sound at which it takes the maximum value within the time interval, and makes other reflection sounds zero. The method of calculation may be presented by a formula as follows:

$$Ei = 1/N \sum_{n=1}^{N} n^2 (n) \qquad (1)$$

(*N:* Number of reflection sounds in a time interval)

where $E_i$ is a magnitude of reflection sound extracted in the time interval i as shown in FIG. 4, h (n) is an impulse response stored in the memory circuit 10, and n is a parameter representing time.

The number i as shown in the formula above is the number of reflection sounds which enable the convolution to be performed in the sound field controller 13.

The calculation above corresponds to (A) and (B) in FIG. 4, and is in reality compressed to the number of reflection sounds which make processing possible with the sound field controller. The method of this compression adopts, for instance, a way in which reflection sounds in a number possible to perform the convolution are taken in the order from a bigger sound from the reflection sounds compressed to (B) in FIG. 4.

In this way, the reflection sounds determined by the calculation circuit 11 are set in the sound field controller 13 by the setting circuit 12, thereby allowing a greater number of reflection sounds determined by measurement and calculation to be compressed to the number of reflection sounds which are actually processable.

However, with such a conventional reflection sound compression apparatus, there is no means to appraise the physical approximation level between the original impulse response and the reflection sound as determined, and that there is a problem such as setting data in the sound field controller by extracting the data without objectivity to a high degree so that this approximation level finally needs correction in accordance with a human psychological scale.

SUMMARY OF THE INVENTION

An object of the present invention is to provide a reflection sound compression apparatus capable of suitably extracting and compressing reflection sounds in accordance with a physical evaluation scale.

In order to attain the above object, a reflection sound compression apparatus of the present invention comprises:

a signal generating means for generating a random signal such as white noise, first memory means having stored therein a predetermined impulse response, a reflection sound extracting means for extracting a specific number of reflection sounds by time-compression from the impulse rewsponse stored in the first memory means, second memory means for storing the extracted reflection sounds, first calculating means for performing convolution of the output signal from the signal generating means and the impulse response stored in the first memory means, second calculating means for performing convolution of the output signal from the signal generating means and the reflection sounds stored in the second memory means, third calculating means for calculating a difference between output signals from the first and second calculation means and for correcting the reflection sounds stored in the second memory means by using the calculated difference such that the difference becomes minimum and then storing the corrected reflection sounds in the second memory means, and comparison means for analyzing the difference calculated by the third calculation means and, if the analyzed result satisfies a required condition, stopping the calculation of the third calculation means and setting the reflection sounds stored in the second memory means into a sound field controller.

With the above configuration, the third calculation means consecutively corrects the reflection sounds stored in the second memory means by the learning identification method so that the difference between output signals from the first and second calculating means is made smaller. When the difference becomes within a predetermined condition, the correction of reflection sounds stored in the second memory means by the third calculating means is stopped and the corrected reflection sounds in the second memory means are set to the sound field controller by the comparison means.

Accordingly, a limited number of reflection sounds can be suitably extracted from a certain impulse response according to a physical evaluation scale, thus making it possible to set objective data in the sound field controller.

DESCRIPTION OF THE PREFERRED EMBODIMENTS

Figure 1:
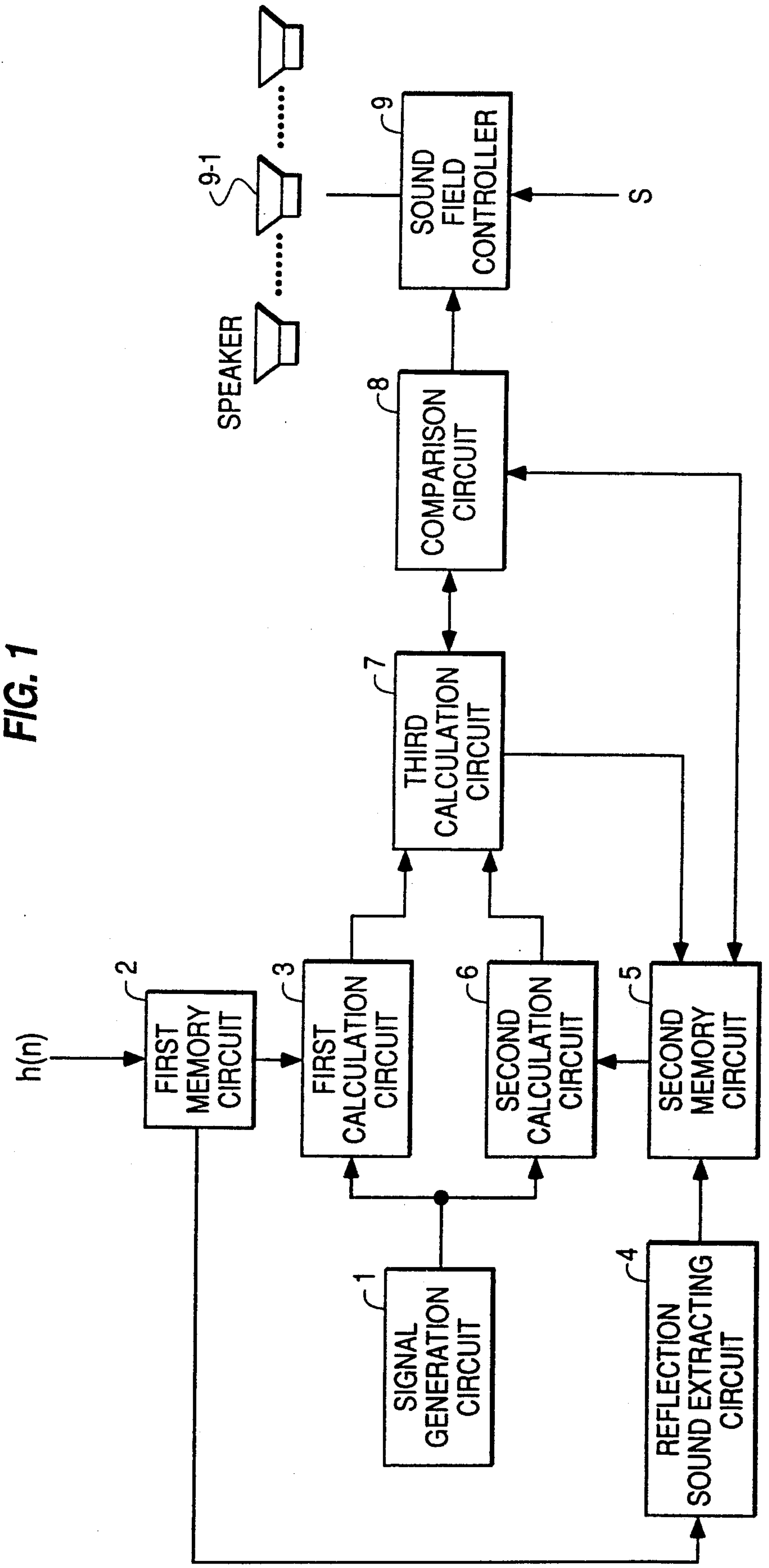
FIG. 1 is a block diagram of a reflection sound compression apparatus in a first embodiment of the present invention.

FIG. 1 is a block diagram of a reflection sound compression apparatus in a first embodiment of the present invention. In FIG. 1, numeral 1 represents a signal generating circuit for generating a random signal such as white noise, etc.; 2 represents a first memory circuit which has stored therein an impulse response of a hall, for example, determined by measurement or calculation such as a computer simulation; 3 represents a first calculation circuit for performing convolution of an output signal from the signal generating circuit 1 and the impulse response stored in the first memory circuit 2; 4 represents a reflection sound extracting circuit which divides the impulse response stored in the first memory circuit 2 into a plurality of time blocks each being preferably 50 msec, extracts from reflection sounds in each time block a reflection sound having a maximum level (others being made zero) to obtain a series of reflection sounds, and extracts a required number of reflection sounds from the series of reflection sounds in the order from the largest level to the smaller (the remaining reflection sounds being made zero); 5 represents a second memory circuit for storing the reflection sounds extracted by the reflection sound extracting circuit 4: 6 represents a second calculation circuit for performing convolution of the output signal from the signal generating circuit 1 and the series of reflection sounds stored in the second memory circuit 5; 7 represents a third calculating circuit for calculating a difference between the calculation results of the first and second calculating circuits 3 and 6 and correcting the series of reflected sounds stored in the second memory circuit 5 by a learning identification method such that the difference between the calculation results of the first and second calculation circuits 3 and 6 becomes minimum; 8 represents a comparison circuit for analyzing the difference between the calculation results of the first and second calculation circuits 3 and 6 calculated by the third calculation circuit 7 and, when the analyzed result satisfies a predetermined condition, stopping the correction calculation of the third calculation circuit 7 and outputting the corrected reflection sounds stored in the second memory circuit 5; 9 represents a sound field controller for generating a sound field by performing convolution of inputted reflection sounds outputted from the comparison circuit 8 and an input musical signal S reproduced from a compact disk, etc. 9-1 represents plural speakers responsive to output signals from the sound field controller; and S represents a musical signal.

Each of the first memory circuit 2 and the second memory circuit 5 includes a RAM (Random Access Memory). The first calculation circuit 3, reflection sound extracting circuit 4, second calculation circuit 6, third calculation circuit 7 and comparison circuit 8 may be realized by a microcomputer.

An impulse response of a hall, etc. determined by measurements or by the sound ray simulation method, etc. has previously stored in the first memory circuit 2. In the reflection sound extracting circuit 4, the impulse response stored in the first memory circuit 2 is read out and divided into a plurality of time blocks (each about 50 msec). Only maximum reflection sounds which are taken among reflection sounds in the respective time blocks are extracted. That is, in each divided time block, only a reflection sound which has the maximum level is left by making the levels of other reflection sounds zero. This process is carried out for all divided time blocks, respectively. After performing the above process, reflection sounds in the number required to be used in the sound field controller are extracted in an order from the largest level reflection sound and the remaining reflection sounds are made zero. The series of extracted reflection sounds are stored in the second memory circuit 5.

When this condition has resulted, a random signal such as white noise, etc. is inputted from the signal generation circuit 1 to the first and second calculation circuits 3 and 6. In the first calculation circuit 3, convolution is performed for the random signal and the impulse response stored in the first memory circuit 2.

When assuming a white noise to be X(n) (n: a parameter showing a sampling time for signal), an impulse response to be h (n) (a length of the impulse response to be N, where $\theta \leqq n \leqq N$), calculating result to be Y (n), the convolution to be performed with the first calculation circuit is expressed in the following formula (All the functions below are dealt as a discrete sequence on a time domain).

$$Y(n) = \sum_{k=1}^{N} X(n) \cdot h(k-n) \quad (2)$$

At the same time, in the second calculation circuit 6, a convolution is performed for the white noise and the reflection sounds stored in the second memory circuit 5. This calculation is expressed as follows by assuming the reflection sound stored in the second memory circuit 5 as h' (n) and the calculation result as Y' (n);

$$Y'(n) = \sum_{k=1}^{N} X(n) \cdot h'(k-n) \quad (3)$$

In the first and second calculation circuits 3 and 6, the calculations as shown in formulae (2) and (3) are performed every time the signal is inputted from the signal generator 1 (every time n advances by one). In the third calculation circuit 7, correction is made for reflection sound h' (n) stored in the second memory circuit 5 by a learning identification method using the calculation results Y (n) and Y' (n) of the first and second calculation circuits 3 and 6.

The correction of h' (n) by the learning identification method is shown in the following formulae;

$$h'(n) = h'(n) + \Delta h'(n) \quad (4)$$

$$\Delta h'(n) = \alpha \cdot e(n) \cdot X(n) / \sum_{n=1}^{N} X^2(n) \quad (5)$$

$$e(n) = Y(n) - Y'(n) \quad (6)$$

$\alpha$: Step size parameter ($0<\alpha<2$)

This correction is also performed each time X (n) is inputted in the same manner as the first and second calculation circuits 3 and 6. The reflection sound thus corrected is again stored in the second memory circuit 5. This correction is consecutively performed until a command to stop the correction comes from the following comparison circuit 8. The comparison circuit 8 receives the difference e(n) between Y(n) and Y'(n) calculated in the third calculation circuit 7, and calculates a root mean square by a certain number of this values. (Experimentally, this number of values depends on h (n), but about 100 is appropriate for N of about 640.)

When this mean value converges on a certain value or becomes less than a certain value (it is experimentally confirmed that it is sure to converge on a certain value), a command is issued to stop the calculation of the third calculation circuit 7 and the corrected reflection sounds which are stored in the second memory circuit 5 are sent to the sound field controller 9.

The process described above allows the impulse response determined by measurement or calculation to be compressed to the number of reflection sounds necessary for the sound field controller.

In the third calculation circuit in the embodiment, a learning identification method is used, but another correction method which makes the difference e(n) minimum may be used.

Figure 2:
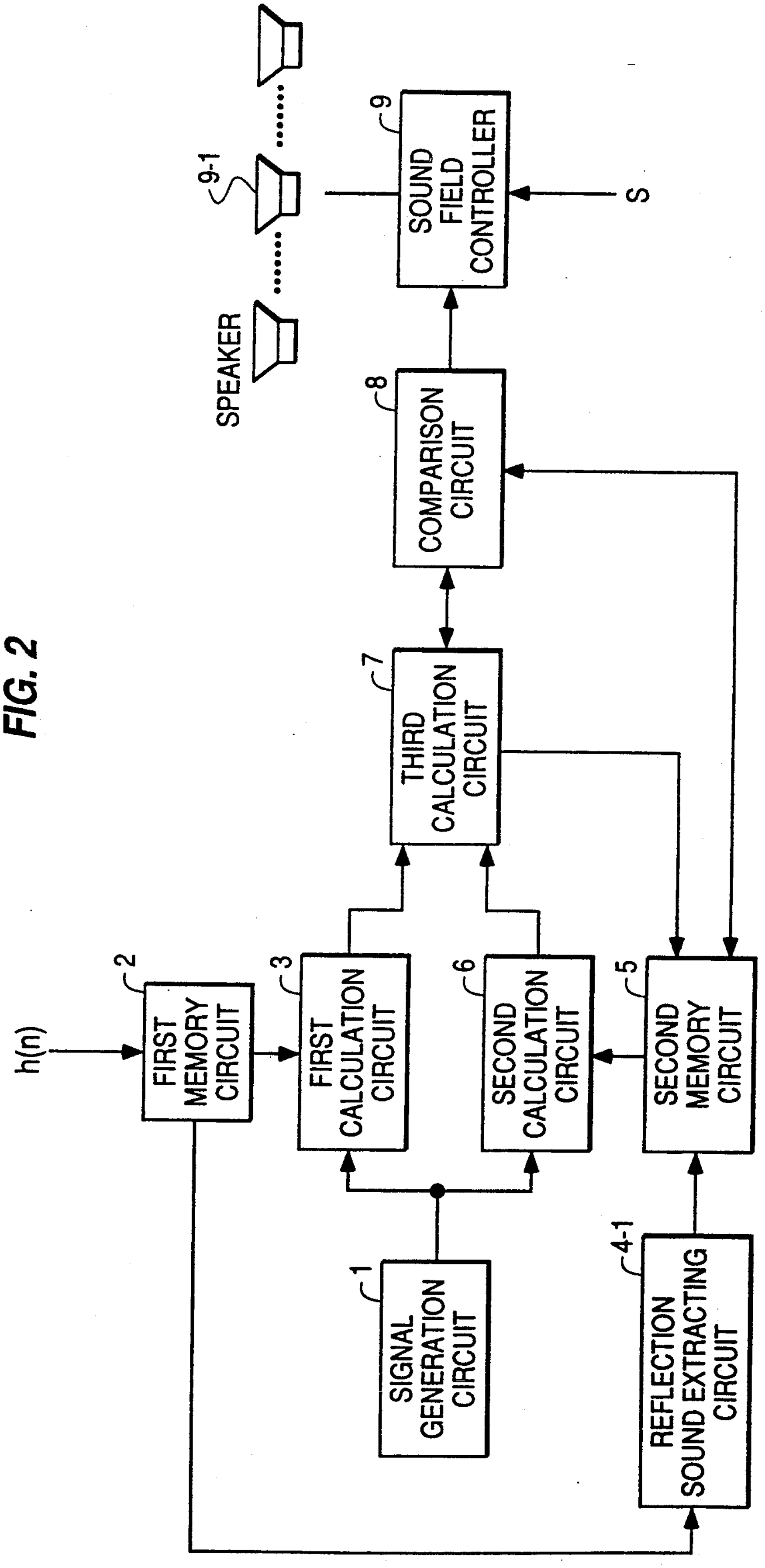
FIG. 2 is a block diagram of a reflection sound compression apparatus in a second embodiment of the present invention.
Figure 3:
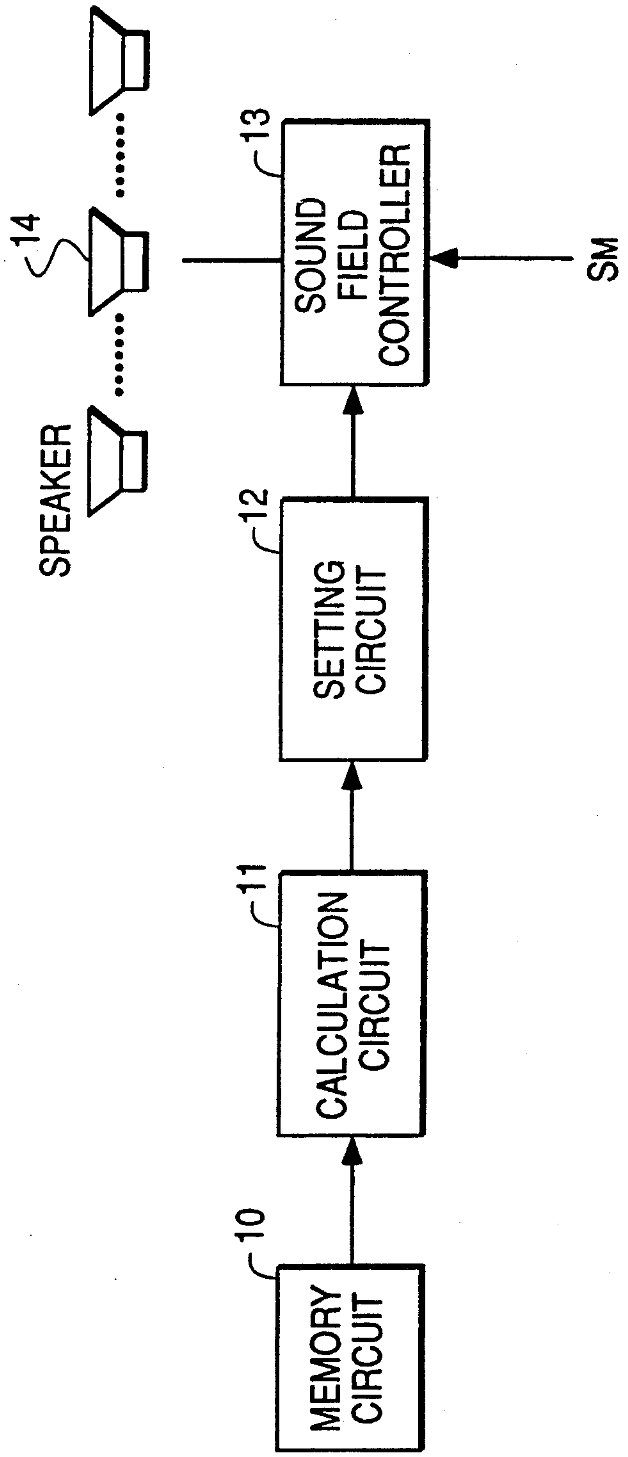
FIG. 3 is a block diagram of a conventional reflection sound compression apparatus.

FIG. 2 shows a block diagram of a reflection sound compression apparatus in a second embodiment of the present invention. In FIG. 2, numeral 4-1 is a reflection sound extracting circuit for reading out the impulse response stored in the first memory circuit 2, integrating the absolute values of certain reflection sounds in each divided time block (experimentally, about 50 msec is preferable), setting the mean value of the absolute values to a position of a reflection sound which has the maximum level in the time block while making other reflection sounds zero to obtain a series of reflection sounds, and for extracting from the series of reflection sounds the necessary number of reflection sounds in order from the largest value to the smaller while making the remaining reflection sounds zero. In the figure, elements which have the same functions as those in FIG. 1 are shown with the same numerals.

Since in the second embodiment only the operation of the reflection sound extracting circuit 4-1 is different from the first embodiment, its operation alone is explained below.

In the reflection sound extracting circuit 4-1, the impulse response stored in the first memory circuit 2 is read out and divided into a plurality of time blocks (each being about 50 msec). Absolute values of reflection sounds in each time block are integrated, and the integration result is divided by the number of reflection sounds in the time block to thereby obtain a mean value in the time block. This mean value is set to a time position at which the maximum value of reflection sound level in the time block exists, while making other reflection sound levels in the time block zero. Then, the number of reflection sounds to be used in the sound field controller are extracted from the thus obtained series of mean values in the order from the largest value and making the remaining reflection sounds zero. The extracted series of reflection sounds are stored in the second memory circuit 5.

Figure 4A:
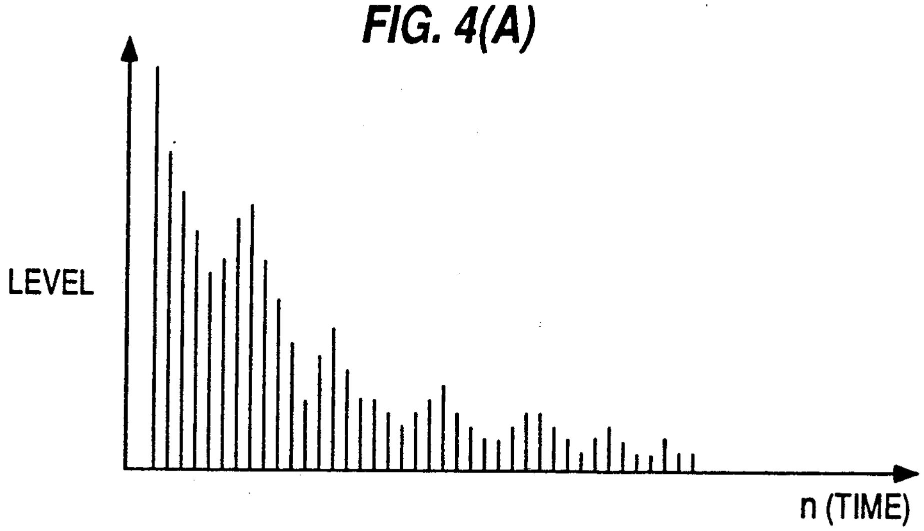
FIGS. 4(A)-(C) are schematic diagrams showing a conventional reflection sound extracting method.
Figure 4B:
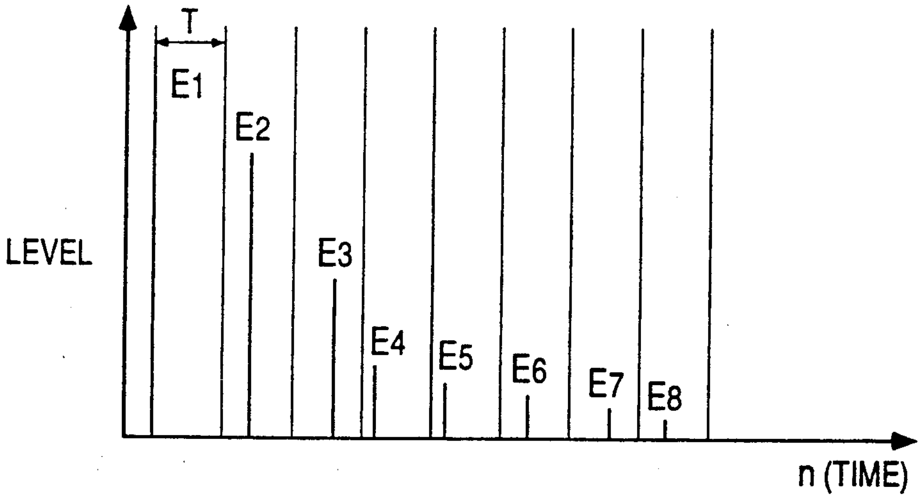
Figure 4C:
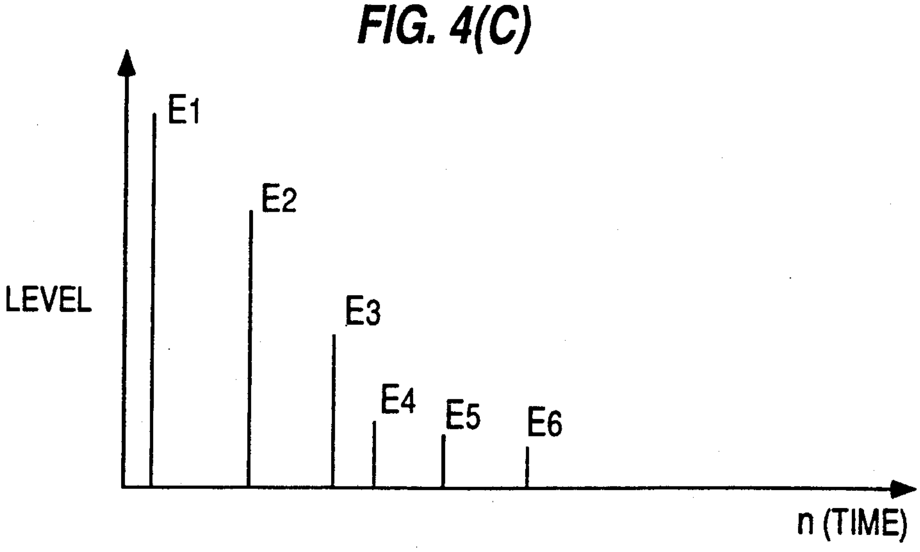

The reflection sounds extracted by the reflection sound extracting circuit 4-1 are the same as those shown in FIG. 4.

Other actions are the same as those in the first embodiment.

What is claimed is:

1. A reflection sound compression apparatus comprising:

signal generating means for generating a random signal;

first memory means having stored therein a predetermined impulse response;

reflection sound extracting means for compressing and extracting a predetermined number of reflection sounds from the impulse response stored in the first memory means;

second memory means for storing the reflection sounds extracted from the reflection sound extracting means;

first calculation means for preforming convolution of the impulse response stored in the first memory means and the random signal generated from the signal generating means;

second calculation means for performing convolution of the reflection sounds stored in the second memory means and the random signal generated from the signal generating means;

third calculation means for calculating a difference between output signals from the first and second calculation means and correcting the reflection sounds stored in the second memory means using the calculated difference; and comparison means for analyzing said difference calculated by the third calculation means, and, when the analyzed result satisfies a predetermined condition, stopping the calculation of the third calculation means and setting the reflection sounds stored in the second memory means to a sound field controller for producing a sound field from the set reflection sounds and a music signal.

2. An apparatus as set forth in claim 1, wherein the reflection sound extracting means divides the impulse response stored in the first memory means into a plurality of time blocks, extracts only a reflection sound which takes a maximum level from reflection sounds in each time block while making zero other reflection sounds in the each time block to obtain a series of extracted reflection sounds, and extracts from the series of extracted reflection sounds the predetermined number of reflection sounds in an order from the largest level to the smaller while making zero the remaining reflection sounds.

3. An apparatus as set forth in claim 1, wherein the reflection sound extracting means divides the impulse response stored in the first memory means into a plurality of time blocks, replaces a reflection sound having a maximum level in each time block by a reflection sound having a mean value of levels of reflection sounds in the each time block while making zero other reflection sounds in the each time block to thereby obtain a series of extracted reflection sounds, and extracts from the series of extracted reflection sounds the predetermined number of reflection sounds in an order from the largest level to the smaller while making zero the remaining reflection sounds.

4. An apparatus as set forth in claim 1, wherein the comparison means calculates a root mean square of the difference from the third calculation means, and, when the value of said root mean square becomes equal to a predetermined value, stops the calculation of the third calculation means and sets the reflection sounds stored in the second memory means to the sound field controller.

5. A reflection sound compression apparatus comprising:

signal generating means for generating a random signal X(n), where n is a parameter indicating a signal sampling time;

first memory means having stored therein a predetermined impulse response h(n), where $0 \leq n \leq N$, N being a length of the impulse response;

reflection sound extracting means for compressing and extracting a predetermined number of reflection sounds h'(n) from the impulse response stored in the first memory means;

second memory means for storing the reflection sounds h'(n) extracted from the reflection sound extracting means;

first calculation means for performing convolution of the impulse response h(n) stored in the first memory means and the random signal X(n) from the signal generating means to obtain a signal Y(n) where:

$$Y(n) = \sum_{k=1}^{N} X(n) \cdot h(k - n);$$

second calculation means for performing convolution of the reflection sounds h'(n) stored in the second memory means and the random signal X(n) from the signal generating means to obtain a signal Y'(n) where:

$$Y'(n) = \sum_{k=1}^{N} X(n) \cdot h'(k - n);$$

third calculation means for calculating a difference $e(n) = Y(n) - Y'(n)$ between the output signals from the first and second calculation means and using said difference for correcting the reflection sounds stored in the second memory means in accordance with a correction calculation expressed as:

$h'(n) = h'(n) + \Delta h'(n)$ $$\Delta h'(n) = \alpha \cdot e(n) \cdot X(n) / \sum_{n=1}^{N} X^2(n)$$

$\alpha$: a step size parameter, where $0 < \alpha < 2$, and then storing the corrected reflection sounds in the second memory means; and comparison means for analyzing the difference e(n) calculated by the third calculation means, and, when the analyzed result satisfies a predetermined condition, stopping the calculation of the third calculation means and setting the reflection sounds stored in the second memory means to a sound field controller for producing a sound field from the set reflection sounds and a music signal.

* * * * *